(12) United States Patent
Zachan et al.

(10) Patent No.: US 7,417,514 B2
(45) Date of Patent: Aug. 26, 2008

(54) METHOD FOR MODULATING PHASE OR FREQUENCY IN A COMMUNICATION SYSTEM USING CLOCK DIVISION

(75) Inventors: Jeff Zachan, Aliso Viejo, CA (US); David Hartman, Laguna Hills, CA (US); Ming Lin, Milpitas, CA (US); Morten Damgaard, Laguna Hills, CA (US); Scott Kee, Dana Point, CA (US)

(73) Assignee: Axiom Microdevices, Inc., Irvine, CA (US)

( * ) Notice: Subject to any disclaimer, the term of this patent is extended or adjusted under 35 U.S.C. 154(b) by 61 days.

(21) Appl. No.: 11/440,343

(22) Filed: May 24, 2006

(65) Prior Publication Data

US 2007/0024382 A1 Feb. 1, 2007

Related U.S. Application Data

(60) Provisional application No. 60/684,016, filed on May 24, 2005.

(51) Int. Cl.
*H03C 3/06* (2006.01)

(52) U.S. Cl. ........................ 332/127; 332/103; 332/128; 331/23; 331/34

(58) Field of Classification Search ................. 332/103, 332/127, 128; 331/23, 34
See application file for complete search history.

(56) References Cited

U.S. PATENT DOCUMENTS

| | | | | | |
|---|---|---|---|---|---|
| 6,008,703 | A | * | 12/1999 | Perrott et al. | 332/100 |
| 6,211,747 | B1 | * | 4/2001 | Trichet et al. | 332/128 |
| 6,717,998 | B2 | * | 4/2004 | Adachi et al. | 375/376 |
| 7,095,819 | B2 | * | 8/2006 | Bellaouar et al. | 375/376 |
| 7,224,237 | B2 | * | 5/2007 | Hirano et al. | 332/103 |

FOREIGN PATENT DOCUMENTS

| | | |
|---|---|---|
| EP | 0961412 A1 | 1/1999 |
| EP | 1345375 A2 | 9/2003 |

* cited by examiner

*Primary Examiner*—Robert J. Pascal
*Assistant Examiner*—Levi Gannon
(74) *Attorney, Agent, or Firm*—Jackson Walker L.L.P.; Christopher J. Rourk

(57) ABSTRACT

A direct division modulator is provided. The direct division modulator includes a symbol mapper converting the input data from a binary bitstream to a desired frequency deviation, such as where the frequency deviation data encodes the information from the bitstream. A converter generates a divide value using the desired frequency deviation information, and a summer adds an average value to the divide value. A converter quantizes the divide value and shapes quantization noise associated with the quantized divide value. A divider modulates a reference signal with the quantized divide value and generates an output signal.

20 Claims, 3 Drawing Sheets

METHOD FOR MODULATING PHASE OR FREQUENCY IN A COMMUNICATION SYSTEM USING CLOCK DIVISION

RELATED APPLICATIONS

This application claims priority to U.S. Provisional Application 60/684,016, filed May 24, 2005, entitled "A METHOD FOR MODULATING PHASE OR FREQUENCY IN A COMMUNICATION SYSTEM USING CLOCK DIVISION," which is hereby incorporated by reference for all purposes.

FIELD OF THE INVENTION

The present invention relates generally to communication techniques using phase or frequency modulation, such as in conjunction with a power amplifier.

BACKGROUND OF THE INVENTION

There are a number of approaches to solving the problem of modulating radio frequency (RF) carrier phase and frequency. The translational loop (TL), or offset phase-locked loop (PLL) uses a mixer in the feedback path of a transmit PLL to offset the output carrier frequency and an analog baseband I/Q data modulator in either the reference or feedback path of the transmit PLL to apply modulation. The primary drawback to the TL is that it requires well matched IF circuits that can occupy much more area than a design comprised primarily of digital blocks.

Another approach to modulating the output RF carrier is to apply the modulation via the feedback divider in a fractional-N PLL synthesizer. In this case a sigma-delta programmed multi-modulus divider is typically used to vary the loop output frequency and/or phase. The primary drawback to this architecture is that it requires careful calibration of the loop components and pre-emphasis filtering of the digital data in order to mitigate the distortion caused by the filtering in the PLL when the data bandwidth is greater than or comparable to the loop bandwidth. In some cases, this calibration can be more difficult by the fact that the fractional-N PLL bandwidth must be made narrower than the signal bandwidth in order to reject the shaped sigma-delta quantization noise and reference source noise.

In an integrated circuit with an integrated power amplifier (PA) in the modulation path, which causes temperature drift of loop components during a burst, the design requires either an adaptive pre-emphasis filter or a technique for adaptively adjusting the loop gain, both of which are non-optimal.

SUMMARY OF THE INVENTION

Therefore, a modulation technique is provided where the data requires no or minimal pre-emphasis, so the loop bandwidth of the transmit loop can be kept wide with respect to the data bandwidth.

In particular, a direct division modulation technique is provided that allows a wide loop bandwidth to be provided relative to the data bandwidth.

In accordance with an exemplary embodiment of the present invention, a direct division modulator is provided. The direct division modulator includes a symbol mapper converting the input data from a binary bitstream to a desired frequency deviation, such as where the frequency deviation data encodes the information from the bitstream. A converter generates a divide value using the desired frequency deviation information, and a summer adds an average value to the divide value. A converter quantizes the divide value and shapes quantization noise associated with the quantized divide value. A divider modulates a reference signal with the quantized divide value and generates an output signal.

The present invention provides many important technical advantages. One important technical advantage of the present invention is a modulation architecture where the transmit loop is a translational loop with an integrated power amplifier which can mitigate AM/PM distortion created by the power amplifier if the power amplifier is within the loop.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
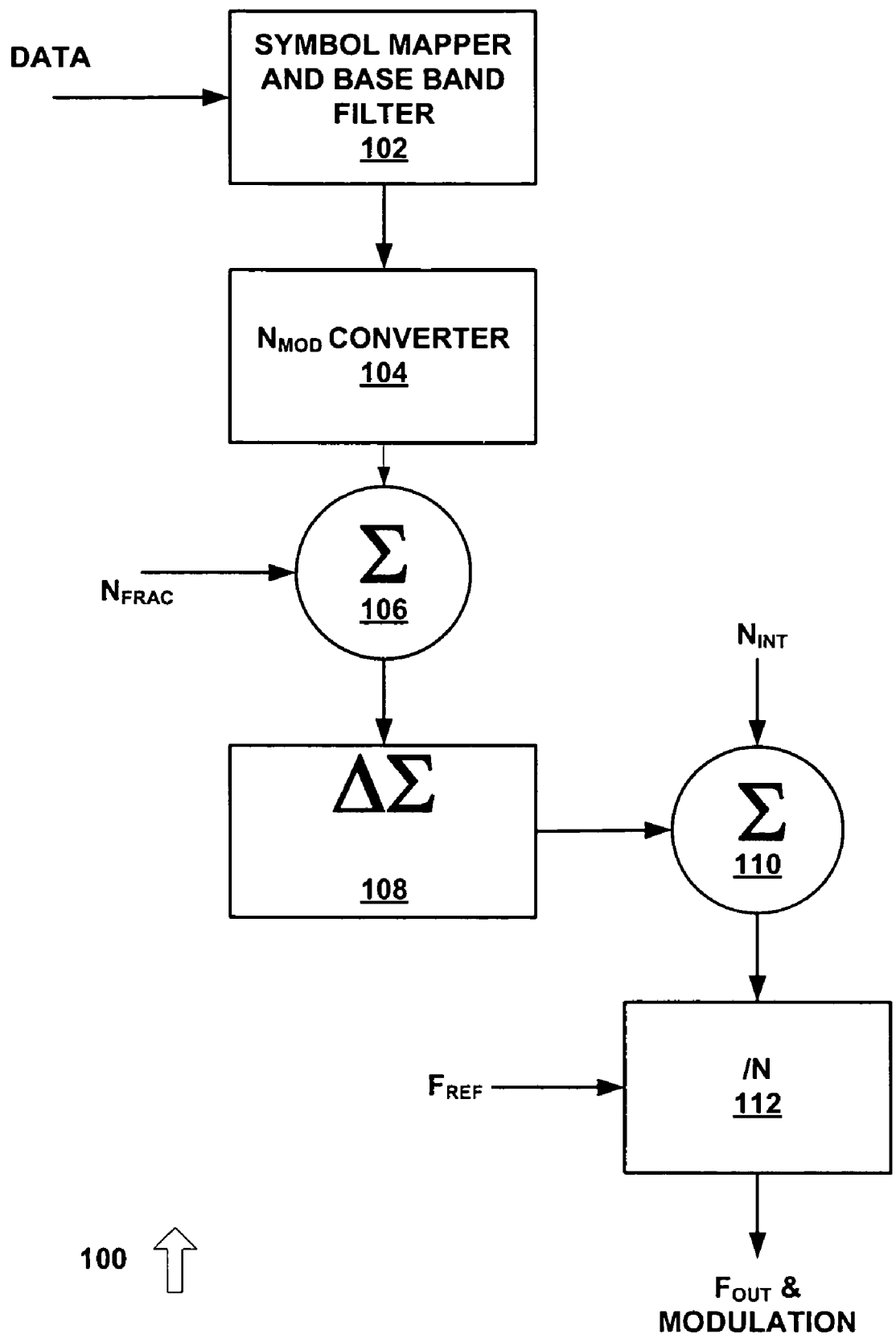
FIG. 1 is a diagram of a process for direct divided modulation (DDM) as a phase/frequency modulation technique, in accordance with an exemplary embodiment of the present invention.

In the description which follows, like parts are marked throughout the specification and drawing with the same reference numerals, respectively. The drawing figures may not be to scale and certain components may be shown in generalized or schematic form and identified by commercial designations in the interest of clarity and conciseness.

FIG. 1 is a diagram 100 of a process for direct divided modulation (DDM) as a phase/frequency modulation technique, in accordance with an exemplary embodiment of the present invention. This technique can be used with GSM signals, EDGE signals, or other suitable applications, such as where the carrier phase or frequency is modulated. A programmable divider is used to apply phase or frequency modulation to a periodic source signal.

In one exemplary implementation, the DDM adds phase and/or frequency modulation via the divider /N 112 to the input clock signal $F_{ref}$. $F_{ref}$ is a signal applied to the DDM that can come from a source that operates at a suitable clock frequency, including an integer-N frequency synthesizer, fractional-N synthesizer, crystal oscillator, or other suitable sources.

Data in a digital format is input to symbol mapper and baseband filter 102, which converts the input data from a binary bitstream to a digitized instantaneous frequency output. This output defines the desired frequency deviation at $F_{out}$. Once the data has been mapped, filtered and converted to a frequency value, it is provided to $N_{mod}$ converter 104, which manipulates the output from symbol mapper and baseband filter 102 into a frequency divide word that can be added to a channel select divide value $N_{Frac}$ in summer 106. In this manner, the frequency deviation information is converted into a divide value for modulating the frequency, such that the divide value is inversely proportional to the frequency deviation information. $N_{Frac}$ is added to give an average divide value, to allow a particular output frequency at $F_{out}$ to be selected to modulate around.

In one exemplary embodiment, $N_{Frac}$ is related to $F_{ref}$ and $F_{out}$ (e.g., $N_{int}+N_{frac}$ would be 5.25 if $F_{ref}$ is 5.25 gigahertz and $F_{out}$ is one gigahertz). Sigma-delta (ΔΣ) converter 108 quantizes the divide value to a smaller number of bits and shapes the error caused by quantization in such a way that the error is small near the desired frequency but larger at frequencies that are farther away from the desired frequency. In one exemplary embodiment, the shaping algorithm essentially takes the three most significant bits of a 26 bit divide value, where the error signal is further used to shape the signal. The output of sigma-delta converter 108 is summed through summer 110 with a suitable integer divide value $N_{int}$ to provide further channel selection programmability. Adding a constant value biases the output divide value, essentially allowing selection of the average divide value. It is further noted that $N_{int}$ can pass through the sigma-delta converter 108 if added to the input stream to sigma-delta converter 108, it can be provided to the signal stream either before after sigma-delta converter 108.

The output of summer 110 is presented to the divider /N 112, where its output, $F_{out}$, represents a divided value of $F_{ref}$ with data and modulation. Divider /N 112 can be a programmable counter or other suitable frequency dividing circuit.

$F_{out}$ can be transmitted unaltered or can be further processed, filtered, up-converted, or down-converted. Likewise, a suitable form of digital and/or analog filtering can be applied to $F_{out}$, direct up conversion via mixing of $F_{out}$ can be applied, up conversion of $F_{out}$ via an offset PLL or translation loop can be applied, or other suitable signal processing techniques can be applied.

Figure 2A:
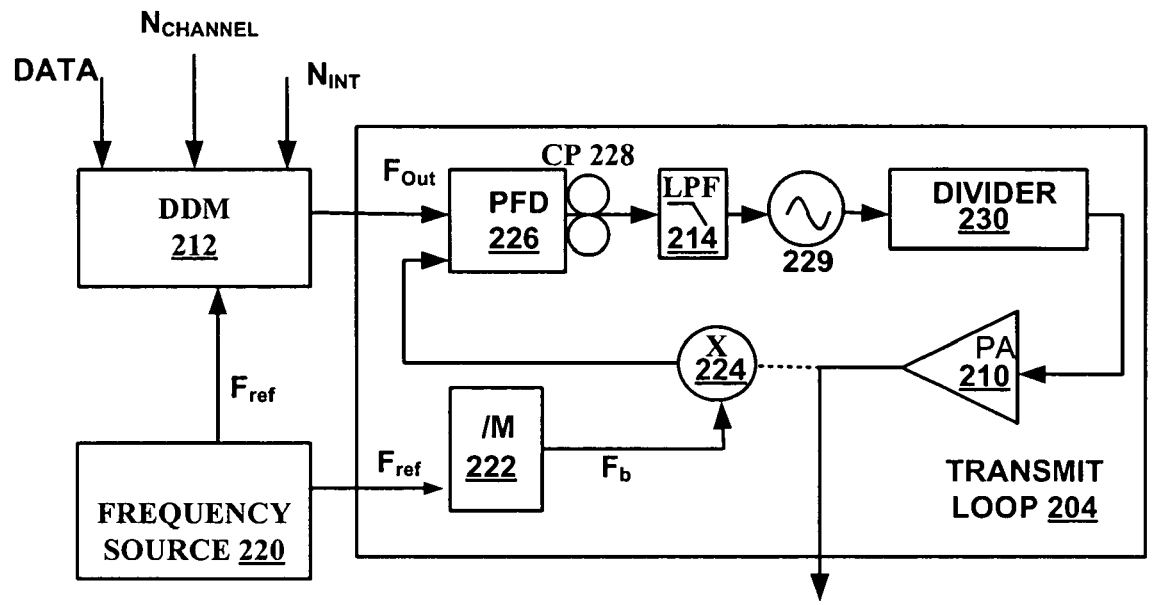
FIGS. 2A and 2B are diagrams of systems showing exemplary implementations the of the DDM modulator with an associated transmitter in accordance with an exemplary embodiment of the present invention.
Figure 2B:
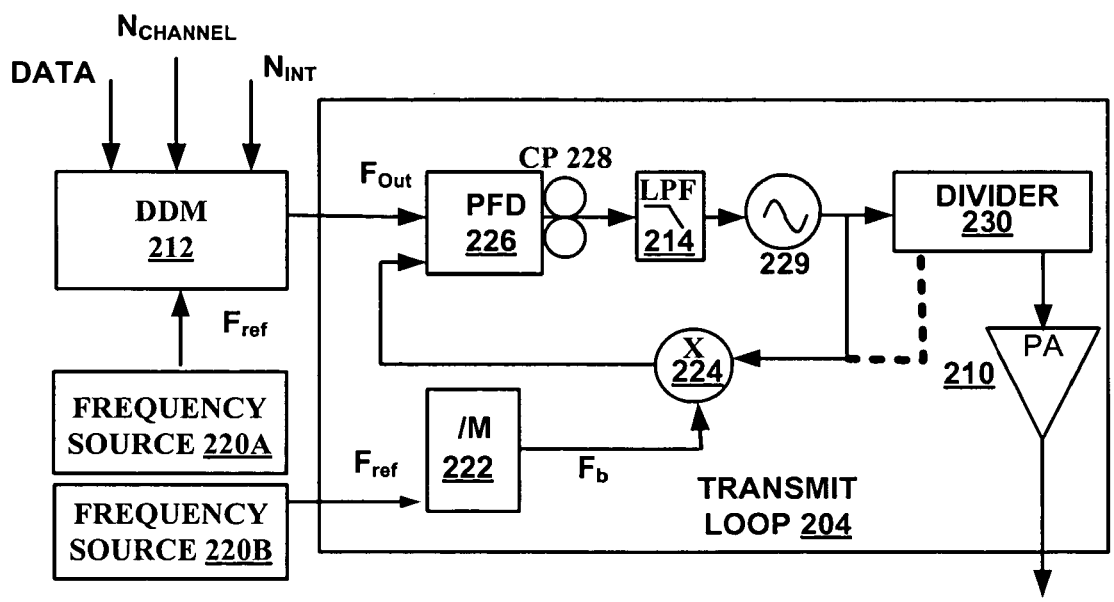

FIGS. 2A and 2B are diagrams of systems 200A and 200B showing an implementation the of the DDM modulator with an associated transmitter in accordance with an exemplary embodiment of the present invention. System 200A allows modulation to be applied directly to transmit translation loop.

System 200A can be implemented in a compact and mostly digital implementation, in one exemplary embodiment. Transmit loop 204 is a translational loop (TL) with a power amplifier 210 that mitigates amplitude modulation and phase modulation distortion when the power amplifier is within the loop and allows for a wide closed loop bandwidth. Direct divided modulator (DDM) 212 allows the transmit loop bandwidth to be kept wide, such as to allow error correction of errors introduced in the output by the power amplifier, but can also be implemented without a power amplifier.

System 200A converts the input signal to a suitable output frequency through the action of mixer 224 and attenuates the phase noise introduced by DDM 212. The input data requires little or no pre-emphasis as the loop bandwidth of transmit loop 204 can be kept wide with respect to the data bandwidth. The frequency plan is highly flexible since DDM 212 can divide by any suitable number, which can also help to avoid unwanted spurs by providing multiple options to generate a given frequency. If reference clock feed-through is an issue in transmit loop 204, $F_{out}$ can be adjusted to a higher frequency to allow for more attenuation via transmit loop low-pass filter 214.

In one exemplary embodiment, system 200A operates using reference frequency source 220 to produce the input clock $F_{ref}$ to DDM 212. Input data and $N_{frac}$ are also provided to DDM 212 as described in FIG. 1.

Clock signal $F_{ref}$ is applied to DDM 212 to produce the modulated reference $F_{out}$, and is also provided to /M divider 222, having a division factor of M, which in one exemplary embodiment is programmable. The output of /M divider 222 is clock signal $F_b$, which is applied to mixer 224 in the feedback path of transmit loop 204, which mixes the output of transmit loop 204 down to the same frequency as modulated reference $F_{Out}$.

Both the output of the DDM 212 and the output of mixer 224 are applied to phase-frequency detector 226. Down conversion is accomplished by mixing the output of /M divider 222 and power amplifier 210. The output of phase-frequency detector 226 is applied to charge pump (CP) 228, the output of which is then applied to low-pass filter 214 to pass a modulation signal that is applied to voltage-controlled oscillator 229, which produces the modulated output signal at the output radio frequency or at a multiple of the output radio frequency.

The modulated output signal is then divided, where suitable, such as by divider 230, and the signal is then applied to power amplifier 210, which amplifies the signal to a suitable transmit level. The output of power amplifier 210 is sensed (as shown by the dotted line) and applied to the feedback loop.

In one exemplary embodiment, transmit loop 204 can be a $4^{th}$ order Type II (charge pump phase-frequency detector) loop with mixer 224 in the feedback path. Power amplifier 210 can be integrated in the loop in order to track amplitude modulation to phase modulation (AM to PM) distortion in an EDGE transmission mode or other suitable data. The loop bandwidth can be kept wide in order to avoid distorting the transmitted signal and to minimize synchronization problems with the amplitude modulation loop.

System 200B utilizes an architecture similar to that of system 200A, except that the output from voltage-controlled oscillator 229 is provided to both divider 230 and mixer 224, so as to eliminate the need to provide feedback to mixer 224 from power amplifier 210. Furthermore, the voltage-controlled oscillator 229 can also be provided to only the divider 230, in which case, the mixer receives the output of the divider 230 as shown by the dotted line. Lastly, voltage-controlled oscillator 229 can be used to drive both power amplifier 210 and mixer 224, eliminating divider 230. System 200B further utilizes two exemplary reference frequency sources 220A and 220B, each generating a reference frequency of $F_{ref}$. Reference frequency sources 220A and 220B can likewise be used in conjunction with system 200A.

Figure 3:
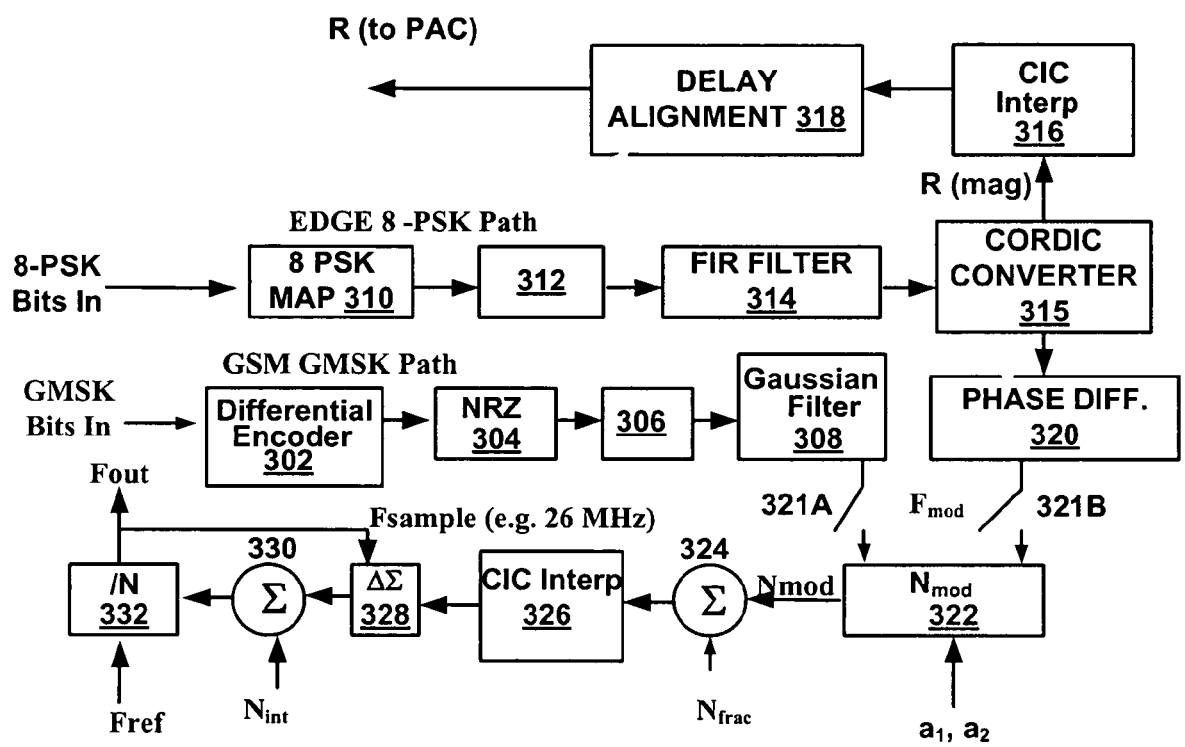
FIG. 3 is a diagram of a system showing an implementation the of the DDM modulator digital processing as it would be used in a GSM/EDGE system in accordance with an exemplary embodiment of the present invention.

FIG. 3 is a diagram of a system 300 showing an implementation of the DDM modulator in conjunction with digital processing as it would be used in a GSM/EDGE system in accordance with an exemplary embodiment of the present invention. System 300 provides an exemplary embodiment of symbol mapper and base band filter 102 and Nmod calculation and interpolation.

System 300 includes registers for the static fractional ($N_{frac}$) and integer ($N_{int}$) divide values and the two coefficients associated with calculating $N_{mod}$. System 300 receives input bits from the serial data interface and can perform suitable processes for GMSK modulation. In one exemplary embodiment, differential encoder 302 receives the input bit stream, and non-return to zero encoder 304 (NRZ) maps [0,1] bit sequences to [1,−1]. Up-sampler 306 increases the sample rate to a suitable number, such as 12 samples per symbol. Gaussian filter 308 is then applied to reduce the signal bandwidth according to the GSM specification.

For the exemplary EDGE 8 phase-shift keyed bits of data, the following operations can be used. The 8 phase-shift keyed bits of data are mapped by 8-PSK mapper 310 to extract the in-phase and quadrature phase data. Up-sampler 312 increases the sample rate to a suitable number, such as 12 samples per symbol. FIR filter 314 is then applied to the signal to reduce the signal bandwidth according to the GSM specification. In-phase/quadrature-phase to R/Theta conversion is then performed, such as by CORDIC converter 315 or other suitable converters. The magnitude R(mag) is passed to the AM loop through cascaded integrator-comb (CIC) interpolation filter 316 and delay alignment 318.

The phase to frequency conversion signal path can be common from CORDIC converter 215, which can provide the phase data to a phase differentiator 320. Output from Gaussian filter 308 or phase differentiator 320, labeled as $F_{mod}$, is provided to $N_{mod}$ calculator 322 through switch 321A or 321B, depending upon the mode of operation (GSM or EDGE). The Nmod output is then added to a suitable fixed fractional offset $N_{frac}$ via summer 324. The signal can then be up-sampled to a suitable sample frequency, such as 26 MHz, and filtered by interpolator 326. One suitable method of accomplishing upsampling and filtering is through the use of a CIC filter. The division word is then applied to sigma-delta modulator 328, which is clocked by the output modulated signal. A suitable division value is applied to /N divider 332, which also receives reference frequency $F_{ref}$.

Differential encoder 302 can be started as if it had received a sequence of 1's. This means that the d[i−1] value (in the register) at start-up can be a 1. Each successive bit can be calculated as shown:

$$y[i]=d[i] \oplus d[i-1]$$

$$d[-1]=1$$

Likewise, GMSK non-return to zero encoder 304 mapping can be used to convert the differentially encoded data to a binary non-return to zero format, such as where the circuit maps [0 1] to [1 −1]:

$$a[i]=1-2y[i]$$

In one exemplary embodiment, the GMSK Gaussian filter 308 can use a symmetric 60-tap FIR filter with 12 samples per symbol. The input data can be up-sampled prior to applying the Gaussian filter.

In another exemplary embodiment, 8-PSK mapper 310 can map the input 3 bit symbol to an in-phase and quadrature phase constellation point, and can also perform 3π/8 rotation or other suitable rotation that may be required after each symbol, such as by 3GPP TS 45.004, Technical Specification Group GSM/EDGE Radio Access Network; Modulation, which is hereby incorporated by reference for all purposes.

FIR filter 314 can be an 8-PSK transmit filter, such as a 60-tap FIR filter or other suitable filters. The tap values and number of symbols over which to filter can be selected as suitable, such as to comply with 3GPP TS 45.004, Technical Specification Group GSM/EDGE Radio Access Network; Modulation. The input data can up-sampled by up-sampler 312, such as to 12 samples per symbol or other suitable samples, prior to filtering.

CORDIC converter 315 is used to generate amplitude and phase (R/Theta) values from the in-phase/quadrature-phase base-band output of the FIR filter 314, such as by use of a CORDIC algorithm or other suitable algorithms. In one exemplary embodiment, an iterative algorithm, such as one that uses a look-up table for angle calculation, can be used. The size of the table can be the same as the number of iterations, or other suitable sizes. The word-width can be set to maintain the RMS phase error below a predetermined level, such as 1°. A fixed magnitude correction can be applied after the R/Theta calculation, such as that described in Hu, YH, "CORDIC-Based VLSI Architectures for Digital Signal Processing," IEEE Signal Processing Magazine, July 1992, which is hereby incorporated by reference for all purposes.

The phase to frequency conversion can be performed using a simple differentiator with its output value scaled by the sample frequency. The sample frequency word can be stored in a register and used to multiply the delta between successive phase samples.

In one exemplary embodiment, frequency to $N_{mod}$ conversion can be performed using a second order Taylor series that avoids the necessity for a division (or inversion) of the modulation frequency, such as where the division may be necessitated by the action of the DDM modulation. One exemplary formula is:

$$N_{mod} = a_1 F_{mod} + a_2 F_{mod}^2$$

$$a_1 = \frac{(N_{int} + N_{frac})^2}{F_{ref}}$$

$$a_2 = \frac{(N_{int} + N_{frac})^3}{F_{ref}^2}$$

where:
$F_{ref}$=frequency of a reference frequency source
$N_{int}$=fixed integer value
$N_{frac}$=fractional divide value
$a_1$, $a_2$=coefficients calculated in advance of the burst.

The interpolator 326 can be used to upsample and filter the frequency data to a rate suitable for application to sigma-delta modulator 328 which is operated at the IF frequency. If this were done without any intervening interpolation filtering the resulting sample images would lie at multiples of 3.25 MHz, which would make the rejection requirement in the transmit loop difficult to meet. In order to avoid this problem the data can be up sampled to 26 MHz using interpolator 326. One suitable method of accomplishing this upsampling and filtering is through the use of a CIC filter.

In view of the above detailed description of the present invention and associated drawings, other modifications and variations are apparent to those skilled in the art. It is also apparent that such other modifications and variations may be effected without departing from the spirit and scope of the present invention.

What is claimed is:

1. A direct division modulator comprising:
   a symbol mapper converting input data from a binary bitstream to a desired frequency deviation;
   a converter generating a divide value using the desired frequency deviation information;
   a summer adding an average value to the divide value;
   a converter quantizing the divide value and shaping quantization noise associated with the quantized divide value;
   a frequency source providing a reference signal;
   a divider modulating the reference signal with the quantized divide value and generating an output signal; and
   a transmit loop receiving the output signal and the reference signal and modulating the output signal with the reference signal to aid in rejecting the quantization noise.

2. The direct division modulator of claim 1 wherein the divide value is derived from modulation frequency deviation information and the quantized divide value is inversely proportional to an instantaneous output frequency.

3. The direct division modulator of claim 1 wherein the average value comprises an integer portion and a fractional portion.

4. The direct division modulator of claim 1 wherein the average value comprises a fractional portion that is added to the divide value prior to the converter and an integer portion that is added to the quantized divide value prior to modulation of the divide value with the divider.

5. The direct division modulator of claim 1 wherein the converter is a sigma-delta converter.

6. The system of claim 1 further comprising a selector allowing controllable processing of an 8-PSK signal or a GMSK signal.

7. The system of claim 6 further comprising a FIR filter in a signal processing path for the 8-PSK.

8. The system of claim 7 further comprising a Gaussian filter in a signal processing path for the GMSK signal.

9. A system for transmitting a signal comprising:
a frequency source generating a reference signal;
a direct division modulator receiving a binary bitstream of input data, modulating a desired frequency deviation onto the reference signal, and dividing the modulated reference signal by a predetermined number to generate an output signal; and
a transmit loop receiving the output signal and the reference signal and modulating the output signal with the reference signal to aid in rejecting quantization noise.

10. The system for transmitting a signal of claim 9 wherein the transmit loop further comprises:
a divider receiving the reference signal and reducing the reference signal to a transmission frequency of the modulated output signal.

11. The system of claim 10 further comprising a phase-frequency detector receiving a signal derived from the clock signal and the output signal and outputting a noise-reduced output signal.

12. The system of claim 9 wherein the direct division modulator further comprises a selector allowing controllable processing of an 8-PSK signal or a GMSK signal.

13. The system of claim 12 wherein the direct division modulator further comprises a FIR filter in a signal processing path for the 8-PSK.

14. The system of claim 12 wherein the direct division modulator further comprises a Gaussian filter in a signal processing path for the GMSK signal.

15. The system of claim 9 wherein the divide value is derived from modulation frequency deviation information and the divide value is inversely proportional to the frequency deviation information.

16. The system of claim 9 wherein the predetermined number is one of an integer or a fraction.

17. A method for direct division modulator comprising:
converting input data from a binary bitstream to a desired frequency deviation;
generating a divide value using the desired frequency deviation information;
adding an average value to the divide value;
quantizing the divide value and shaping quantization noise associated with the quantized divide value;
modulating a reference signal with the quantized divide value and generating an output signal; and
receiving the output signal and the reference signal and modulating the output signal with the reference signal to aid in rejecting the quantization noise.

18. The method of claim 17 wherein the divide value is derived from modulation frequency deviation information and the quantized divide value inversely proportional to an instantaneous output frequency.

19. The method of claim 17 wherein the average value comprises a fractional portion that is added to the divide value prior to the quantizing step an integer portion that is added to the quantized divide value prior to the modulating step of the divide value with the divider.

20. The method of claim 17 further comprising selecting between processing of an 8-PSK signal or a GMSK signal.

* * * * *